(12) United States Patent
Uchida et al.

(10) Patent No.: US 6,541,910 B2
(45) Date of Patent: Apr. 1, 2003

(54) ORGANIC EL DISPLAY

(75) Inventors: Masahiro Uchida, Nagano-Ken (JP); Osamu Yokoyama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/825,846

(22) Filed: Apr. 5, 2001

(65) Prior Publication Data

US 2002/0014834 A1 Feb. 7, 2002

(30) Foreign Application Priority Data

Apr. 6, 2000 (JP) ........................................ 2000-104973

(51) Int. Cl.[7] .................................................. H01J 1/62
(52) U.S. Cl. ........................................ 313/504; 313/506
(58) Field of Search ................................. 313/504, 503, 313/506; 428/917; 315/169.3

(56) References Cited

FOREIGN PATENT DOCUMENTS

| JP | A-9-106887 | 4/1997 |
|----|-----------|--------|
| JP | A-2000-21565 | 1/2000 |

*Primary Examiner*—Gary Paumen
*Assistant Examiner*—Ann McCamey
(74) *Attorney, Agent, or Firm*—Oliff & Berridge, PLC.

(57) ABSTRACT

An organic EL display device is provided which has excellent uniformity of luminosity within the display area, even if the display area is relatively large. A plurality of cathode terminals connected to a cathode layer that is disposed on the display area are provided at different locations on the substrate.

6 Claims, 3 Drawing Sheets

ORGANIC EL DISPLAY

BACKGROUND OF THE INVENTION

1. Field of Invention

The present invention relates to an organic EL display device provided with organic EL (electroluminescence) elements that operate as display elements.

2. Description of Related Art

An organic EL element is a self-luminescent element having a structure in which at least one organic light emitting layer is placed between a cathode and an anode. The organic EL element can be driven with a direct current of about 3 V. It is possible to fabricate elements of a variety of light emitting colors. Because an organic EL element has many advantages as a display element, such as the fact that it has a faster response and a wider viewing angle than a liquid crystal display element, it can be used commercially for a variety of diverse applications, such as a pixel or the light source of a display device.

An organic EL panel provided with such organic EL elements, operating as display elements, is manufactured, for example, as follows.

First, on a transparent glass substrate, a transparent conductive thin film for an anode is formed. Next, by performing photolithography and etching the thin film, an anode of an organic EL element (formed with a pattern corresponding to multiple light emitting sections), an anode terminal, a cathode terminal, and wiring between the anode and the terminal are simultaneously patterned.

Next, the glass substrate surface of the parts other than the light emitting sections of the anode and the terminal section are covered with an insulation layer. Then, in the display area (area including all of the light emitting sections and excluding the terminal section) of the glass substrate surface, a hole injection layer and an organic light emitting layer are formed.

Subsequently, a cathode made of metallic thin film is formed on the entire surface of the display area of this glass substrate surface. The cathode is formed with its plane adjusted to the display area, and a pattern having a projection that protrudes from the plane to the outside of the display area, so that the projection is in contact with the cathode terminal.

Thus, in a conventional organic EL panel, only one cathode Terminal is formed on the substrate surface on the entire surface of the display area. Therefore, because an organic EL panel with a relatively large display area also has a large cathode area, a voltage difference is created between a position close to the terminal and another position far from the terminal inside the cathode surface. Namely, a voltage drop easily occurs inside the cathode.

As a result, the amount of electric current provided to the organic EL element inside the display area easily becomes uneven.

Therefore, the uniformity of luminosity within the display area of large, conventional, organic EL elements can possibly be enhanced.

SUMMARY OF THE INVENTION

The present invention addresses the above problems associated with the related art technology, and its object is to provide an organic EL element which exhibits excellent uniformity of luminosity, even if the display area is relatively large.

In order to solve the problem as described above, an organic EL display device in accordance with a first aspect of the invention is provided which includes a layered structure, having an organic light emitting layer between electrode layers formed on a substrate. A first electrode layer, which is one of the electrode layers, is formed in a pattern corresponding to a plurality of light emitting sections. A second electrode layer, which is another electrode layer, is placed on the entire display area. The first terminal connected to the first electrode layer and the second terminal connected to the second electrode layer are formed outside of the display area on the substrate. A plurality of second terminals are formed on the substrate. The second electrode layer is connected to multiple second terminals.

According to the first aspect of the organic EL display device of the present invention, because the second electrode layer is connected to multiple second terminals, compared to cases where it is connected to one second terminal, it is difficult for a voltage drop to occur inside the second electrode layer. Thus, the amount of current provided to the organic EL elements is easily made uniform inside the surface of the display area.

The present invention further provides an organic EL display device, in accordance with a second aspect, which includes a layered structure having an organic light emitting layer, between electrode layers, formed on a substrate. A first electrode layer, which is one of the electrode layers, is formed in a pattern corresponding to a plurality of light emitting sections, and has multiple first electrodes. A second electrode layer, which is another electrode layer, is placed so that it covers the entire portion of the display area where the first electrode is formed. A first terminal connected to the first electrode layer and a second terminal connected to the second electrode layer are formed outside the display area on the substrate. The second electrode layer includes a plurality of second electrodes. A plurality of second terminals are formed on the substrate. The plurality of second electrodes are connected respectively to different second terminals.

According to the second aspect of the organic EL display of the present invention, by dividing the second electrode layer into multiple second electrodes, it is difficult for a voltage drop to occur within the second electrode layer. Thus, the amount of current provided to the organic EL elements is easily made uniform within the surface of the display area.

Also, by connecting the plurality of second electrodes respectively to different second terminals, the amount of current provided to the second electrodes can be made to be different from one another.

The present invention also covers an embodiment of an organic EL display, where the substrate is transparent, the first electrode layer is a transparent anode layer formed on the substrate side, and the second electrode layer is a cathode layer.

The present invention also covers an embodiment of an active matrix type organic EL display, where the first electrode and an organic light emitting layer are formed as a matrix, and the second electrode layer is formed as the common electrode, and an organic EL display where the second electrode layer is transparent.

DETAILED DESCRIPTION OF PREFERRED EMBODIMENTS

An explanation is provided below of embodiments of the present invention.

Figure 1:
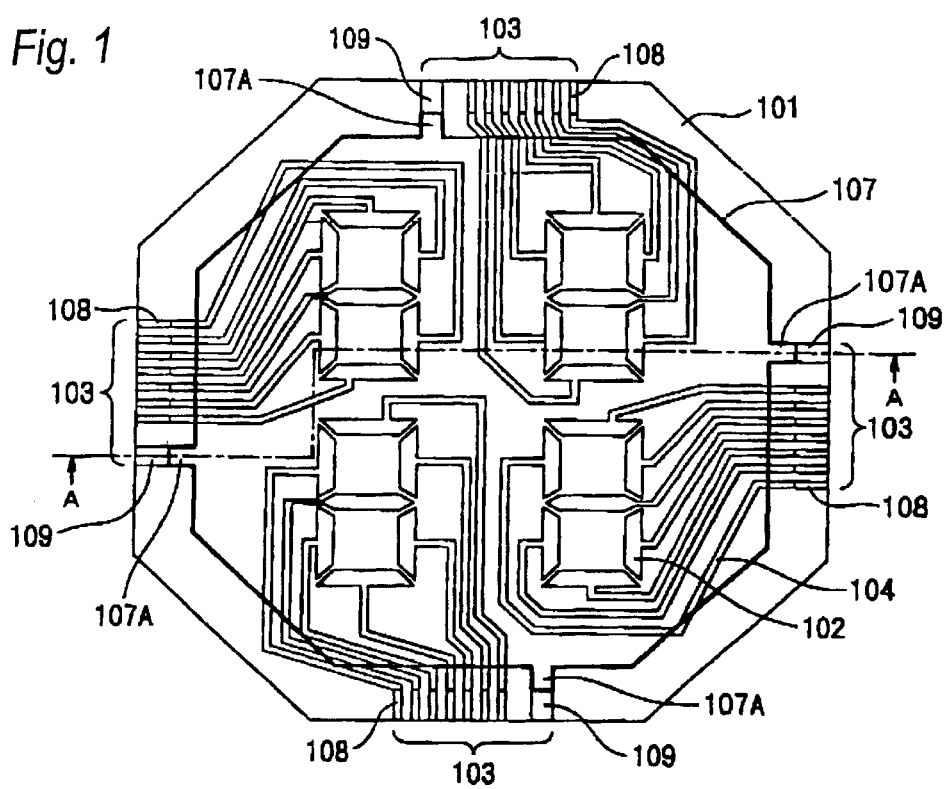
FIG. 1 is a plan view showing the structure of an organic EL display panel in accordance with a first embodiment of the present invention.
Figure 2:
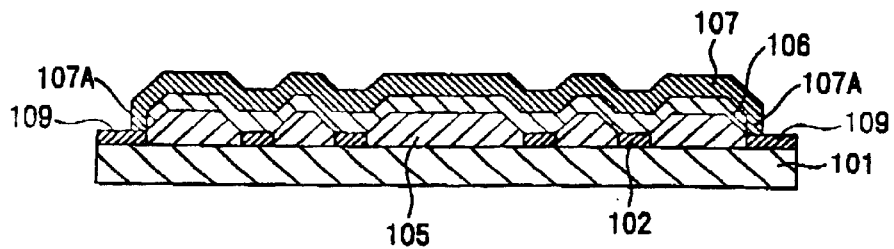
FIG. 2 is a cross-sectional view taken along plane A—A of FIG. 1.

FIG. 1 is a plan view showing the structure of an organic EL display panel in accordance with a first embodiment of the present invention, and FIG. 2 is a cross-sectional view taken along plane A—A of FIG. 1.

This display panel includes a transparent substrate 101, a transparent anode layer (first electrode layer) including an anode (first electrode) 102 and an anode wiring 104, an insulating layer 105, an organic light emitting layer 106 provided with a hole transporting layer etc., and a cathode layer 107.

In FIG. 1, the organic light emitting layer 106 and the insulating layer 105 are omitted, and in FIG. 2 the anode wiring 104 is omitted.

As shown in FIG. 1, the display panel is a display showing four digital numbers, where seven elements (light emitting sections) including each digital number are formed of organic EL elements. For that purpose, the anode 102 is formed on the immediate top of the substrate 101 in a pattern corresponding to each of the light emitting sections.

Also, a dedicated wiring 104 is connected to each anode 102.

Immediately on the substrate 101, other than anodes 102 and wiring 104, 28 terminals 108 for the anode wirings 104, and four terminals 109 for the cathode, are formed. These terminals are grouped for each digital number and are formed as a terminal section 103 on the perimeter outside the octagonal display area. On each terminal section 103, seven anode terminals 108 and one cathode terminal 109 are arranged in parallel.

After a transparent, conductive, thin film is formed on the substrate 101, the anodes 102, the wirings 104, the anode terminals 108, and the cathode terminals 109 are simultaneously formed by accomplishing photolithography and etching of the thin film.

The insulating layer 105 is formed on a portion immediately on the substrate 101 excluding the anodes 102, the wirings 104, the anode terminals 108, and the cathode terminals 109. Because of this insulating layer 105, luminescence in sections other than the light emitting sections, and electric leakage between wirings or terminals that would otherwise occur, are prevented. The organic light emitting layer 106 is formed on the entire surface of the display area.

The cathode layer 107 includes the same octagonal surface as the display area and the four projections 107A protruding from the perimeter of this octagon to the outside of the display area. The projections 107A are formed so that each of them makes contact with respective different cathode terminals 109.

In the present embodiment, a substrate, made of soda glass with a thickness of 0.7 mm, is used as the substrate 101. As the material forming the anode 102, ITO (Indium Tin Oxide; Indium oxide doped with tin oxide) is used, and the thickness of the ITO thin film is made to be 150 mm. An $SiO_2$ layer is formed as the insulating layer 105.

The organic light emitting layer 106 is constructed with a hole injection layer of thickness 50 nm formed of, N'-diphenyl-N,N'-dinaphthyl-1,1'-biphenyl-4,4'-diamine and an electron transporting light emitting layer formed of a tris-(8-hydroxyquinoline) aluminum complex. Also, the hole injection layer and the electron transporting light emitting layer are formed with a thickness of 50 nm, respectively, and the thickness of the organic light emitting layer 15 is made to be 100 nm.

When using the display panel, each terminal section 103, and the corresponding terminal section of the driving circuit, are connected to each other, and the anode terminal 108 and the cathode terminal 109 are connected to each corresponding terminal of the driving circuit. Then, a voltage is applied between the four cathode terminals 109 and the anode terminals 108 of the portion to be made to be light emitting among the seven elements of each digital number by the operation of the driving circuit. The electrified portion of the organic light emitting layer 106 generates luminescence, and one digital number out of "0"~"9" is displayed.

In the display panel of the present embodiment, because the cathode layer 107 is connected to the four cathode terminals 109 provided on the equally separated four locations of the substrate perimeter, compared to cases where it is connected to only one cathode terminal, it is difficult for a voltage drop to occur within the cathode layer 107. As a result, even where the display area is relatively large (4 inches or more, for example), the uniformity of luminosity within the display area is high.

Here, in a configuration where the cathode layer is made to be transparent to light so that light will also be emitted to the cathode side, a voltage drop in the cathode layer occurs easily, because the cathode layer needs to be formed with a thin film having a thickness of about 200 Å for example. Therefore, it is possible to obtain advantages in the display panel of the present embodiment, such as having a uniform luminosity over the entire display area.

Figure 3:
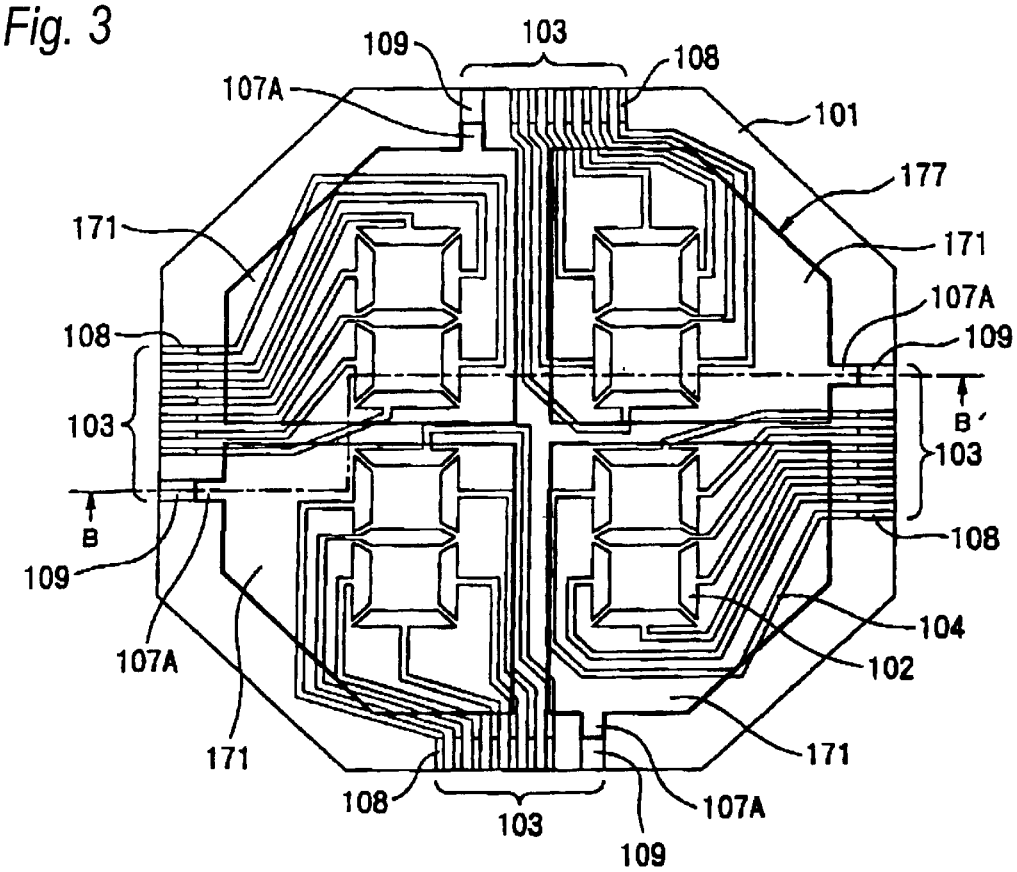
FIG. 3 is a plan view showing the structure of an organic EL display panel in accordance with a second embodiment of the present invention.
Figure 4:
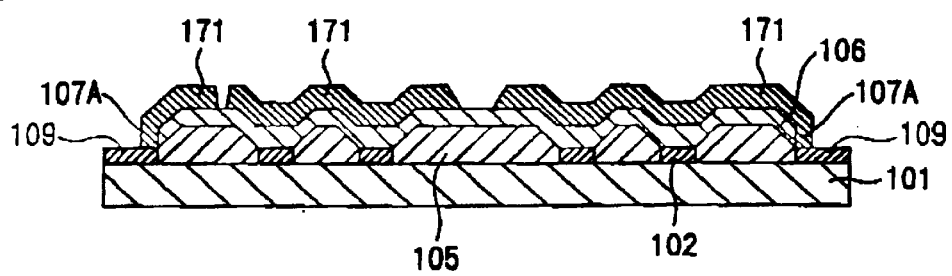
FIG. 4 is a cross-sectional view taken along plane B—B of FIG. 3.

FIG. 3 is a plan view showing the structure of an organic EL display panel in accordance with a second embodiment of the present invention, and FIG. 4 is a cross-sectional view taken along plane B—B of FIG. 3.

The cathode layer 177 of the display panel of the present invention includes four cathodes (second electrodes) 171 having a shape where the octagonal cathode layer 107 of the first embodiment is equally divided. All other features are the same as the first embodiment.

Each of the four projections 107A of the cathode layer 107 of the first embodiment are assigned to one of the cathodes 171 of the cathode layer 177, respectively. Each of the four cathodes 171 is formed so that it covers the whole anode 102, forming one digital number. Each projection 107A of the four cathodes 171 is connected to the cathode terminal 109 placed in the terminal section 103 for the corresponding digital number.

In the display panel of the present embodiment, because the cathode layer 177 is divided into a plurality of cathodes 171, compared to cases where the entire display area is covered with one cathode layer, it is difficult for a voltage drop to occur in the cathode layer. As a result, even in cases where the display area is relatively large (4 inches or more for example), or where the cathode layer is formed with a thin film having a thickness of about 200 Å, for example, in order for it to be able to transmit light, the uniformity of luminosity within the surface of the display area becomes high.

Also, because the four cathodes 171 are connected to respective different cathode terminals 109, the amount of current provided by the cathodes 171 can be made different from one another. As a result, it is possible to divide the display area into a plurality of areas to perform a display in each area with intentional differences in luminosity.

Figure 5:
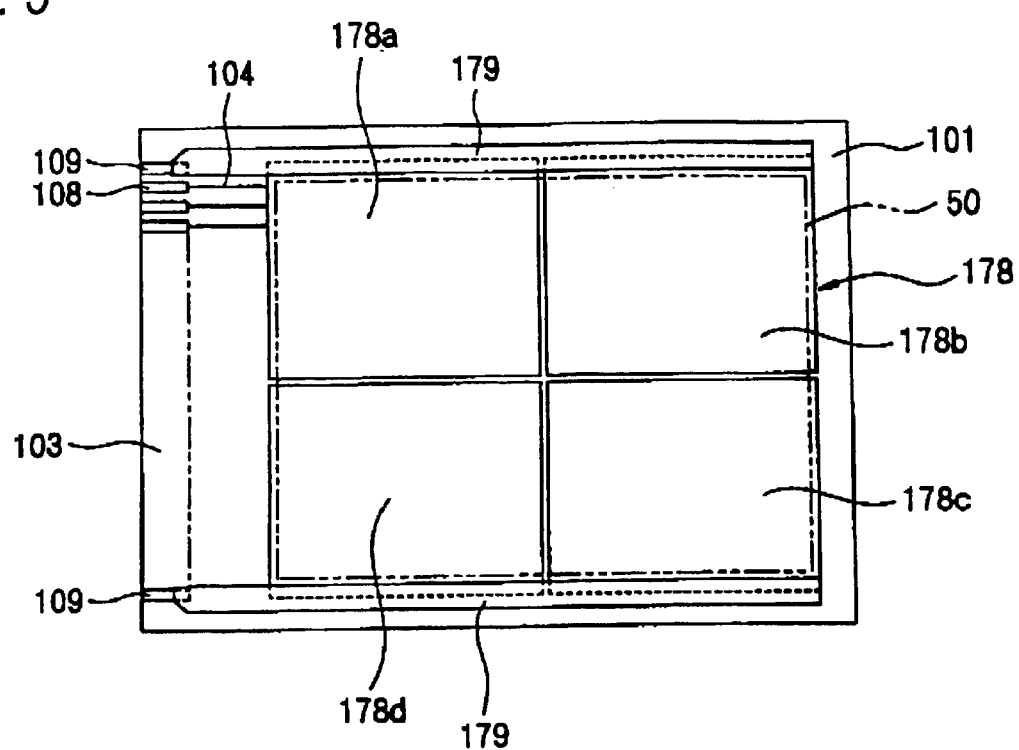
FIG. 5 is a plan view showing the structure of an organic EL display panel in accordance with a third embodiment of the present invention.

FIG. 5 is a plan view showing the structure of an organic EL display panel in accordance with a third embodiment of the present invention.

This display panel is a panel for an active matrix type organic EL display device. The transparent substrate 101 of this panel has a rectangular substrate surface, and the portion of this rectangle, excluding one of the narrow sides and the entire perimeter, is made to be the display area 50.

In this display panel, within the display area 50 on the substrate 101 a transparent anode (first electrode) and an organic light emitting layer are formed in a matrix corresponding to a large number of pixels (light emitting sections). A transparent cathode layer 178 is formed on the entire display area 50 of the organic light emitting layer. The cathode layer 178 is equally divided into four cathodes 178a~178d which become each of the upper, lower, left, and right areas in FIG. 5.

Thin light-reflecting auxiliary electrodes 179 are respectively formed on the top edge of the upper two cathodes 178a and 178b and the top edge of the lower two cathodes 178c and 178d.

On the terminal section 103 are formed a large number of anode terminals 108 and two cathode terminals 109. Each of the anode terminals 108 is connected to the end of terminals of the wire 104A from a large number of anodes formed as a matrix. Also, two cathode terminals 109 are connected to auxiliary electrodes 179 that are connected to two different cathodes.

The transparent cathode layer 178 can be formed of, for example, ① a thin film obtained by co-depositing magnesium (Mg) and silver (Ag), ② a thin film obtained by co-depositing lithium (Li) and aluminum (Al), and ③ a thin film (whose total thickness is 140 Å or less, for example) with a double-layer structure including the first cathode layer (light emitting layer side) made of a material with a small work function and the second cathode layer with a work function larger than the first cathode layer. Calcium (Ca) or magnesium (Mg) can be used as the raw material for the first cathode layer, and aluminum (Al), silver (Ag), and gold (Au) for the second cathode layer, for example.

As the anode having light transmittance, the same ITO as the first embodiment or IZO (Indium Zinc Oxide; Indium oxide doped with zinc oxide) etc. can be used. When using a transparent anode, it is preferable to use metals with high work functions, such as Pt, Ir, Ni, and Cd, or oxides of these metals.

In the display panel of the present embodiment, because the cathode layer 178 is divided into a plurality of cathodes 178a~178d, compared to cases where the entire display area is covered with one cathode layer, it is difficult for voltage drop to occur in the cathode layer. As a result, the uniformity of luminosity within the surface of the display area 50 becomes high.

Here, the higher the formation density of the pixel electrodes is (the larger the number of pixel electrodes formed in a specific display area), the larger the display area occupied with wiring of the pixel electrodes etc., and the smaller the area ratio of the pixel electrodes in the display area. As a result, in an organic EL display panel whose display area is relatively large, such as 4 inches or larger, for example, and which has a light-reflecting cathode as the common electrode, the higher the formation density of anodes which are the pixel electrodes, the lower the brightness of the screen.

Therefore, in an organic EL display panel whose display area is relatively large, such as 4 inches or larger, for example, and which has a high formation density of anodes which are the pixel electrodes, it is preferable that a configuration be made so that light is also irradiated from the cathode side by using a transparent cathode (common electrode).

However, because a transparent cathode needs to be formed with a thin film which is thinner than a light-reflecting cathode, voltage drop occurs easily.

Therefore, in an organic EL display panel where the formation density of the pixel electrodes (first electrodes) is high, it is especially effective to form a plurality of transparent electrodes (second electrodes) which are divided in the display area as the common electrode (second electrode layer), to form multiple second terminals on the substrate, and to connect the multiple second electrodes to respective different second terminals.

As explained above, according to the organic EL display of the present invention, because it is difficult for a voltage drop of the second electrode layer to occur, even in cases where the display area is relatively large, the uniformity of luminosity within the surface of the display area becomes high.

As a result, because there is no need to supply a high voltage on the assumption of a voltage drop in the second electrode layer, it becomes possible to drive the organic EL display with lower electric power consumption than has heretofore been possible.

Especially, according to the organic EL display of the present invention, by having a different amount of current at each of the second electrodes, it becomes possible to divide the display area into a plurality of sections and to perform a display by intentionally creating differences of luminosity to the sections.

What is claimed is:

1. An organic EL display device, comprising:
   a substrate;
   electrode layers formed above the substrate, the electrode layers including a first electrode layer formed in a pattern corresponding to a plurality of light emitting sections, and a second electrode layer disposed on an entire display area, the second electrode layer including a plurality of second electrodes;
   an organic light emitting layer disposed between the electrode layers;
   a first terminal connected to the first electrode layer; and
   a plurality of second terminals formed above the substrate and each connected to one of the plurality of second electrodes, the plurality of second terminals being formed outside of the display area.

2. An organic EL display device, comprising:
   a substrate;
   electrode layers formed above the substrate, the electrode layers including a first electrode layer having a plurality of first electrodes corresponding to a plurality of light emitting sections, the electrode layers also including a second electrode layer which entirely covers the plurality of light emitting sections, the second electrode layer including a plurality of second electrodes;

an organic light emitting layer disposed between the electrode layers;

a first terminal connected to the first electrode layer; and a plurality of second terminals formed above the substrate and each connected to one of the plurality of second electrodes.

3. The organic EL display device according to claim 1, the substrate being transparent, the first electrode layer being a transparent anode layer formed between the substrate and the second electrode layer, and the second electrode layer being a cathode layer.

4. The organic EL display device according to claim 3, the plurality of light emitting sections being disposed in a matrix, and each of the plurality of second electrodes being transparent and common to some of the plurality of light emitting sections.

5. An organic EL display device, comprising:

a first electrode layer including a plurality of individual electrodes;

a second electrode layer opposite to the first electrode layer and including a plurality of common electrodes each corresponding to a part of the plurality of individual electrodes;

an organic light emitting layer disposed between the first and second electrode layers;

a plurality of first terminals connected to the plurality of individual electrodes; and a plurality of second terminals each connected to one of the plurality of common electrodes.

6. The organic EL display device according to claim 5, the plurality of individual electrodes being disposed in a matrix.

* * * * *